United States Patent [19]

Jeon

[11] Patent Number: 5,568,434
[45] Date of Patent: Oct. 22, 1996

[54] MULTI-BIT TESTING CIRCUIT FOR SEMICONDUCTOR MEMORY DEVICE

[75] Inventor: Yong-Weon Jeon, Seoul, Rep. of Korea

[73] Assignee: LG Semicon Co., Ltd., Chungcheongbuk-do, Rep. of Korea

[21] Appl. No.: 377,729

[22] Filed: Jan. 25, 1995

[30] Foreign Application Priority Data

Mar. 24, 1994 [KR] Rep. of Korea .................. 94-5938

[51] Int. Cl.⁶ .................. G11C 29/00; G11C 11/20
[52] U.S. Cl. .................. 365/201; 365/196; 365/205; 365/200
[58] Field of Search .................. 365/200, 201, 365/196, 205; 371/10.1, 10.2

[56] References Cited

U.S. PATENT DOCUMENTS

| | | | |
|---|---|---|---|
| 5,088,063 | 2/1992 | Matsuda et al. | 365/201 |
| 5,184,327 | 2/1993 | Matsuda et al. | 365/201 |

OTHER PUBLICATIONS

"A 45-nc 64-Mb DRAM with a Merged Match-Line Test Architecture", Shigeru Mori et al., IEEE Journal of Solid-State Circuits, 11(26):1486-1491 (1991).

"A 21-mW 4-Mb CMOS SRAM for Battery Operation", Shoji Murakami et al., IEEE Journal of Solid-State Circuits, 11(26):1563-1568 (1991).

Primary Examiner—Viet Q. Nguyen
Attorney, Agent, or Firm—Finnegan, Henderson, Farabow, Garrett & Dunner, L.L.P.

[57] ABSTRACT

A multi-bit testing circuit for testing a semiconductor memory device having a plurality of memory cells. The multi-bit testing circuit includes a first amplifier which is coupled to a first group of memory cells and which senses a pair of bit line signals associated with a respective one of the memory cells of the first group and provides each of the sensed pair of bit line signals to a respective one of first and second output lines of a common signal path; a second amplifier which is coupled to a second group of memory cells and which senses a pair of bit line signals associated with a respective one of the memory cells of the second group and provides each of the sensed pair of bit line signals to a respective one of the first and second output lines of the common signal path; and a third amplifier which is coupled to the first and second output lines of the common signal path and which produces an output signal in response to the sensed pair of bit line signals provided on the first and second output lines.

16 Claims, 4 Drawing Sheets

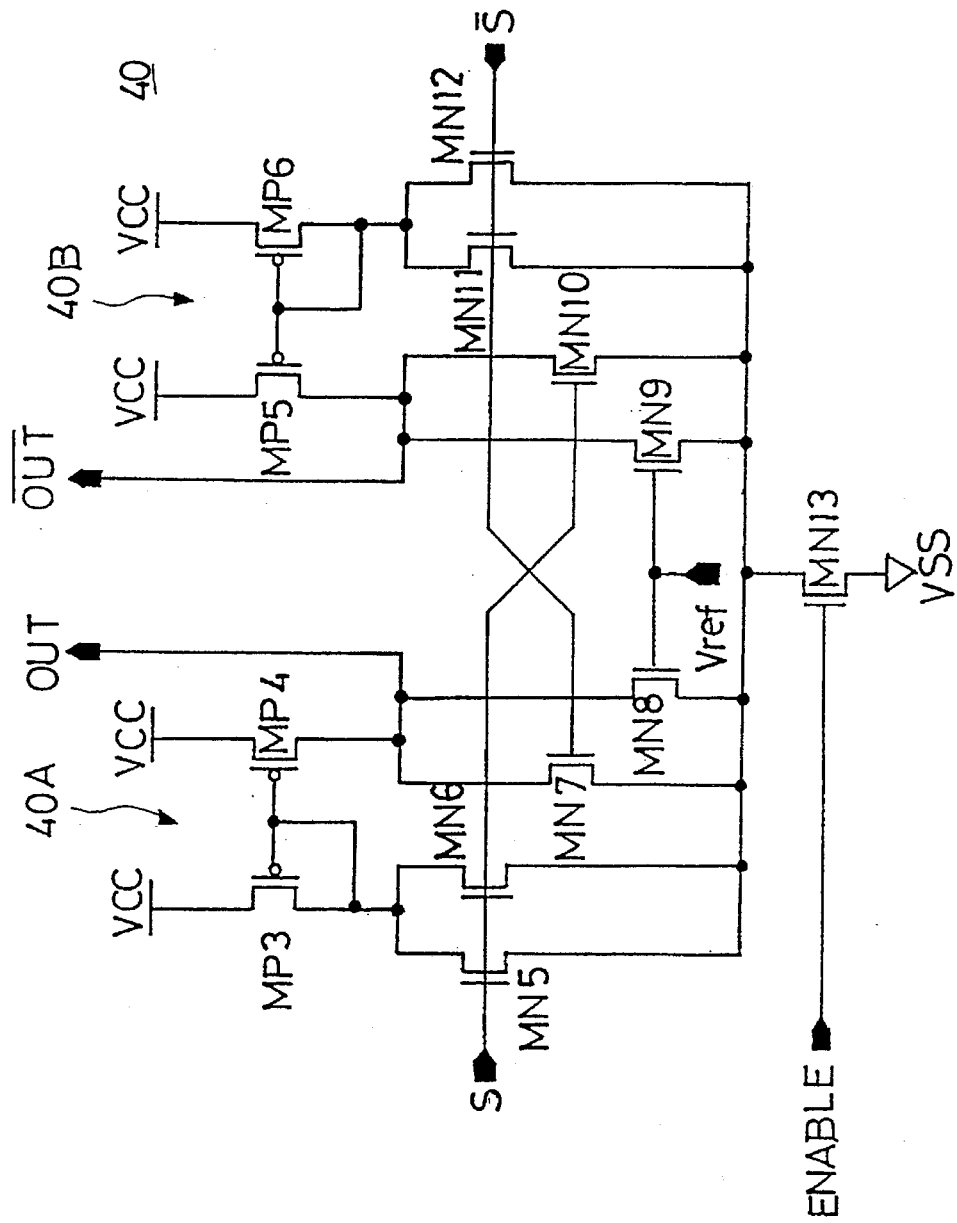

5,568,434

MULTI-BIT TESTING CIRCUIT FOR SEMICONDUCTOR MEMORY DEVICE

FIELD OF THE INVENTION

The present invention relates to a multi-bit testing circuit for a semiconductor memory device, in which the path is the same under both the normal operating mode and the multi-bit testing mode, the expansion of the number of the bits to be tested is rendered easier, and the sensing speed is made to be the same under both the normal operating mode and the multi-testing mode.

BACKGROUND

Semiconductor memory devices which are made by semiconductor wafer processes are desired to be error-free in writing data into and reading data from their individual cells. When such a semiconductor memory device has a small memory capacity, it would not require much time to test the essential functions of the cells of the device. However, when such a semiconductor memory device has a large memory capacity (e.g., memory capacity of over 1 Mb (mega byte) which is commercially available now), it would require much time to test the entire cells of the device one by one.

In order to test the cells more efficiently, more reliably and faster, a multi-bit testing circuit has been devised. Such a high speed and high reliability testing circuit has not only improved the reliability of the memory device, but also reduced the testing time, as well as reducing the size of the cell. One example of such a semiconductor memory multi-bit testing circuit is illustrated in FIGS. 1A and 1B.

FIG. 1A represents the first sensing portion of the multi-bit testing circuit. As shown in FIG. 1A, the memory device includes a plurality of memory cells 1. Each cell is coupled to a pair of a bit line and a reference line. When the circuit operates under a normal operating mode, each of these pairs produces a signal S having values complementary to one another. Referring to FIG. 1A, the conventional multi-bit testing circuit includes a pair of first sense amplifiers 10A and 10B to sense and amplify the data output from the memory cells 1. The first sense amplifiers 10A and 10B further include a column selector (not shown) for selecting one or more columns from a plurality of columns YD0 . . . YDi associated with the first sense amplifier 10A and/or from a plurality of columns YDj . . . YDn associated with the first sense amplifier 10B.

The first sense amplifier 10A, when activated, provide, through a first signal path, outputs SA and $\overline{SA}$ and the first sense amplifier 10B provides, through a second signal path, outputs SB and $\overline{SB}$ likewise. These outputs are provided to a second sense amplifier 20 having a current mirror, as shown in the second sensing portion (i.e., FIG. 1B). This conventional multi-bit testing circuit operates under a normal operating mode or a multi-bit testing mode.

Under the normal operating mode, the column selector selects only one column from the columns YD0–YDi or YDj–YDn. For example, if the column selector selects one column (e.g., YD0) from the columns YD0 to YDi associated with the first sense amplifier 10A, the first sense amplifier 10A becomes activated and outputs complementing data signals as SA and $\overline{SA}$. SA corresponds to the signal sensed from the bit line and $\overline{SA}$ from the reference line associated with the selected column. The first sense amplifier 10B, which is kept deactivated because none of its associated columns have been selected, outputs signals having a voltage corresponding to Vcc as SB and $\overline{SB}$ because PMOS transistors P12 and P13 coupled to SB and barSB are activated while the first sense amplifier 10B is deactivated. Under the multi-bit testing mode, the column selector selects simultaneously more than one, for example, two columns (e.g., YD0 and YDj), and complementary data signals will appear also as SB and $\overline{SB}$.

Referring to FIG. 1B, the second sense amplifier 20 comprises a modified current mirror and receives the output signals from the first sense amplifiers 10A and 10B. Under the normal operating mode, since YD0 is selected, SA would be high, $\overline{SA}$ low, and SB and $\overline{SB}$ high. Then the second sense amplifier 20 outputs complementing data onto output lines OUT and $\overline{OUT}$. That is, a high voltage is applied to the gate of NMOS transistors N1 and N2, which are serially connected to one another, thus allowing the currents to flow therethrough. That in turn activates the current mirror through PMOS transistors P1, P4 and P7.

Further, a low level voltage is applied to the gate of an NMOS transistor N7 and a high level voltage to an NMOS transistor N8, thus disallowing the currents to flow therethrough. In the end, the output line OUT outputs a high level voltage, while the output line $\overline{OUT}$ outputs a low level voltage. These output signals from the output lines OUT and $\overline{OUT}$ are provided to an output buffer.

Similarly, suppose that YDj associated with the first sense amplifier 10B is selected and the associated cell is initially set to a low value. Then, under the normal operating mode, SA and $\overline{SA}$ would be high, SB low, and $\overline{SB}$ high. Then a high voltage is applied to the gates of the NMOS transistors N7 and NS, which are connected in series with respect to one another, allowing the currents to flow therethrough. Consequently, the current mirror operation is performed through PMOS transistors P9, P3 and P6. Further, a low level voltage is applied to the gate of the NMOS transistor N2 and a high level voltage to the gate of the NMOS transistor N1, disallowing the currents to flow therethrough. Consequently, the output line OUT outputs a low level voltage, while the output line $\overline{OUT}$ outputs a high level voltage. Therefore, the status of SA, $\overline{SA}$, SB and $\overline{SB}$ can be checked on the output lines OUT and $\overline{OUT}$.

Under the multi-bit testing mode, two situations would exist. In the first situation, the first sense amplifiers 10A and 10B output identical data. For example, two identical high level signals appear as SA and SB and are applied to the second sense amplifier 20, while two identical low level signals appear as $\overline{SA}$ and $\overline{SB}$ and are applied to the second sense amplifier 20. In this situation, the second sense amplifier 20 operates much like when it is in the normal operating mode described above, and outputs normal data having a high or low signal level. In the second situation, the first sense amplifiers 10A and 10B output different data, which will be discussed more in detail below.

As indicated above, under the multi-bit testing mode, the column selector selects simultaneously more than one column, for example, one column from the columns YD0–YDi associated with the first sense amplifier 10A and another column from the columns YDj–YDn associated with the first sense amplifier 10B. One of SA and $\overline{SA}$ and one of SB and $\overline{SB}$ shall have a low signal level. One of two states "PASS" and "FAIL" is indicated based on the output which appears on the output lines OUT and $\overline{OUT}$.

Under this circumstance, if the first sense amplifiers 10A and 10B output the same data (either same high or same low), PASS is indicated. For example, suppose that same high level signals appear as SA and SB and are applied to the second sense amplifier 20, while same low level signals appear as $\overline{SA}$ and $\overline{SB}$. Then, the second sense amplifier 20 operates as in the normal operating mode, thereby outputting high and low signals as normal data on the output lines.

On the other hand, when the first sense amplifiers 10A and 10B output different data, FAIL is indicated. For example, suppose that SA is high; $\overline{SA}$ low; SB low; and $\overline{SB}$ high, then no currents will flow through NMOS transistor N1 and N2 which are serially connected one another, thereby deactivating the current mirror to operate through the PMOS transistor P1, P4 and P7. Further, no currents will flow through the serially connected NMOS transistor N7 and N8, thereby deactivating the current mirror to operate through the PMOS transistors P9, P3 and P6.

Moreover, since the NMOS transistors N3 and N6, which receive high voltage signals, are connected to the NMOS transistor N4 and N5 in series respectively, while the serially connected NMOS transistor N3 and N4 and the serially connected NMOS transistors N5 and N6 are connected in parallel with respect to one another, when the current flows through the NMOS transistors N3 and N6, the current mirror is allowed to operate through the PMOS transistors P5, P2 and P8. Consequently, both the outputs OUT and $\overline{OUT}$ of the second sense amplifier 20 become high, resulting in a high impedance on the output of the output buffer, thus indicating FAIL. Accordingly, the error status of the cells in the memory device is indicated.

As is apparent in the above description, the same circuit can operate both under the normal operating mode as well as the multi-bit testing mode. However, in such a multi-bit testing circuit for a semiconductor memory device, it is difficult to increase the number of the cells (or bits) to be tested; the number of bits that can be tested is limited. Further, when the signals which are applied to the second sense amplifier are weak, the operation of the current mirror circuit becomes unstable, resulting in incorrect output data and thus degrading the test accuracy.

Yet further, since the reliability of the multi-bit testing circuit relies on that of the operation of the current mirror circuit, and since the amount of the current flowing through the current mirror, when the current mirror is activated, can be varied, the operating speed of the circuit under the normal operating mode can be different from that under the multi-bit testing mode.

SUMMARY OF THE INVENTION

The object of the present invention is intended to overcome the problems and disadvantages of the above described conventional multi-bit testing circuit.

To achieve this and other objects of the present invention, the multi-bit testing circuit for testing a semiconductor memory device having a plurality of memory cells of the present invention, as embodied and broadly described herein, comprises a first amplifying means coupled to a first group of memory cells for sensing at least one pair of bit line signals having values complementary to one another, each pair being associated with a respective one of the memory cells of the first group and for providing each of the sensed pair of bit line signals to a respective one of first and second output lines of a common signal path when the first sense amplifying means is activated; a second amplifying means coupled to a second group of memory cells for sensing at least one pair of bit line signals having values complementary to one another, each pair being associated with a respective one of the memory cells of the second group and for providing each of the sensed pair of bit line signals to a respective one of the first and second output lines of the common signal path when the second sense amplifying means is activated; and a third amplifying means coupled to the first and second output lines of the common signal path for producing an output signal in response to the sensed pair of bit line signals provided on the first and second output lines.

The objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

The accompanying drawings, which are incorporated in and constitute a part of this specification, illustrate one embodiment of the invention and together with the description, serve to explain the principles of the invention.

BRIEF DESCRIPTION OF THE DRAWINGS

FIGS. 2A and 2B illustrate a multi-bit testing circuit for a semiconductor memory device according to an embodiment of the present invention including FIG. 2A a first sensing portion and FIG. 2B a second sensing portion.

DESCRIPTION OF THE PREFERRED EMBODIMENT

Reference will now be made in detail to the preferred embodiment of the invention, an example of which is illustrated in the accompanying drawings. Wherever possible, the same reference numbers will be used throughout the drawings to refer to the same or like parts.

Figure 1A:
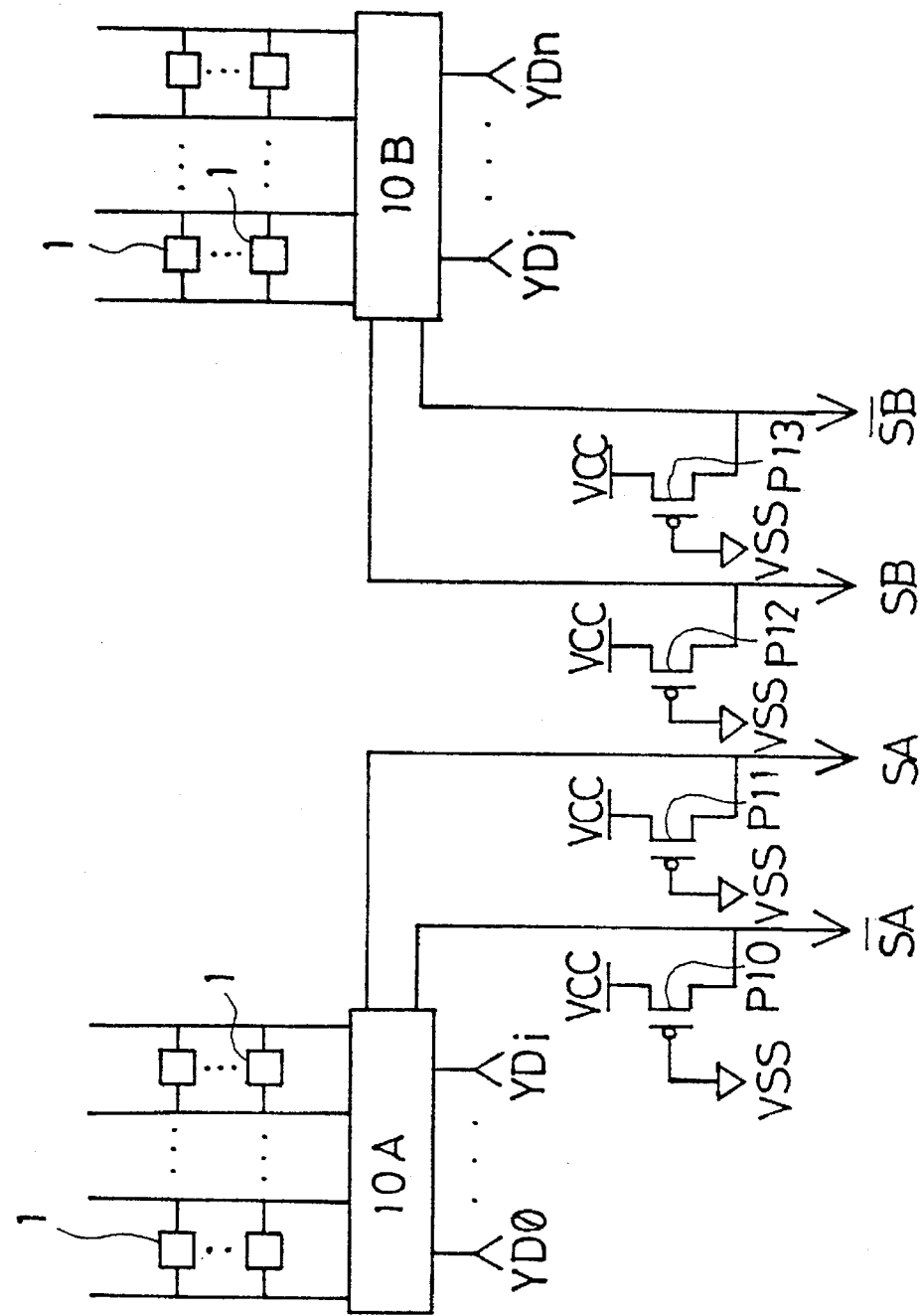
FIGS. 1A and 1B illustrate a conventional multi-bit testing circuit for a semiconductor memory device including FIG. 1A a first sensing portion and FIG. 1B a second sensing portion.
Figure 1B:
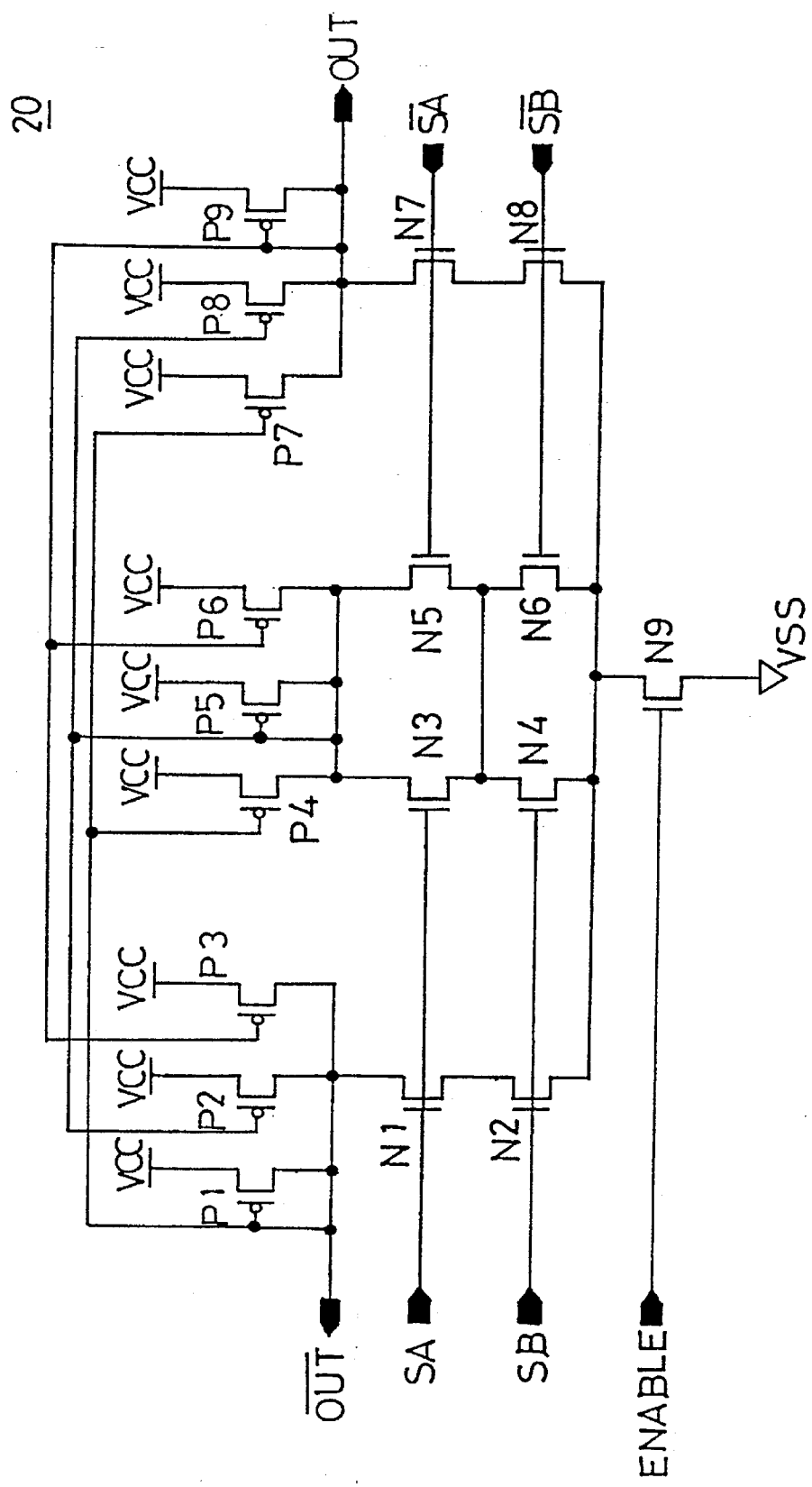
Figure 2A:
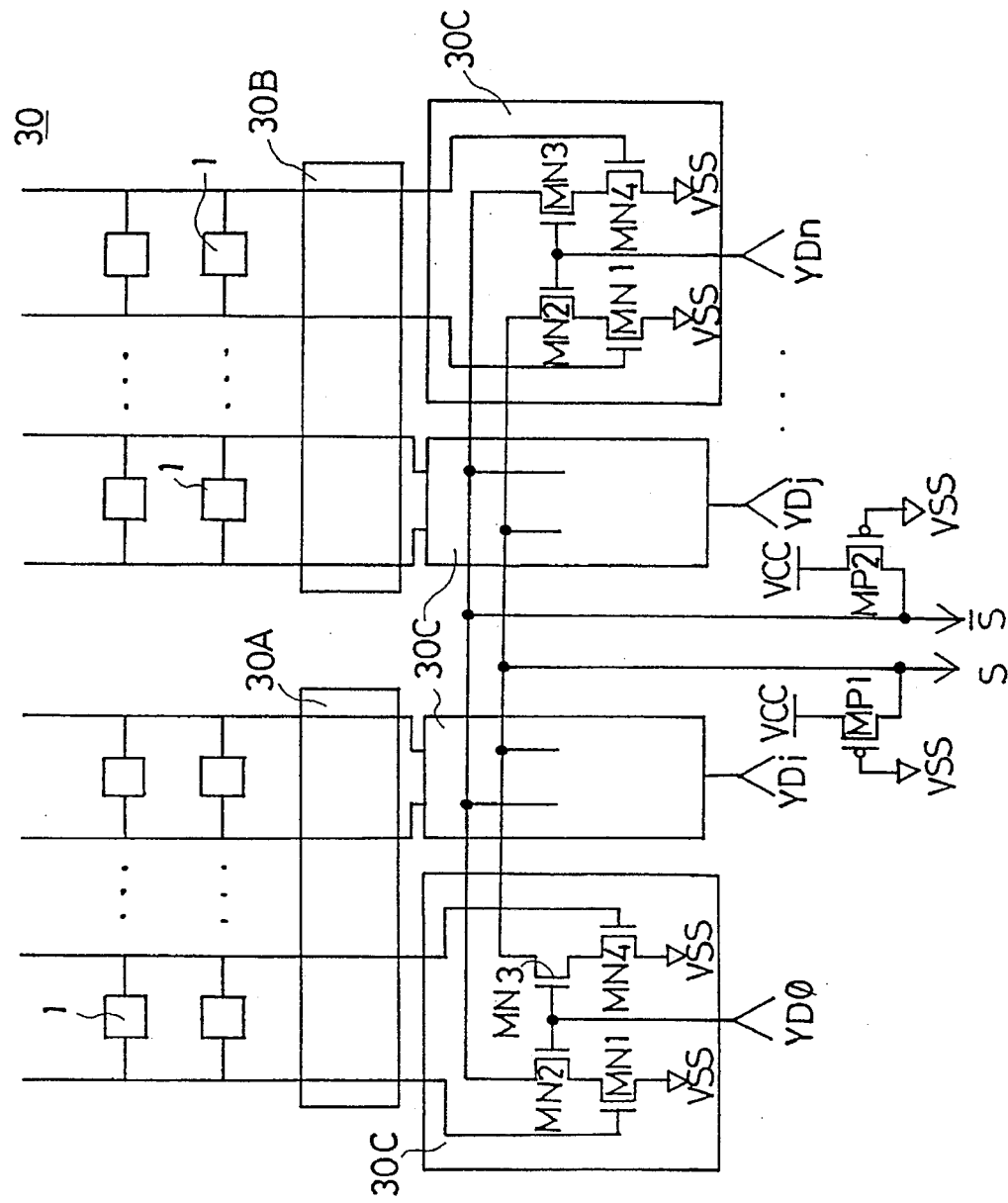

FIGS. 2A and 2B show a multi-bit testing circuit according to an embodiment of the present invention. FIG. 2A shows a first sensing section 30 and FIG. 2B shows a second sensing section 40 comprising the multi-bit testing circuit. In the multi-bit testing circuit, as embodied herein, the first sensing section 30 includes first sense amplifiers 30A and 30B, and a direct sense amplifier (DSA) circuit 30C which receives bit line signals from the sense amplifiers 30A and 30B.

The first sense amplifiers 30A and 30B output complementary output signals S and $\overline{S}$ onto a common signal path having first and second output lines. These output signal S and $\overline{S}$ are in turn applied to the second sensing section 40 (shown in FIG. 2B) to perform normal or testing operations.

The DSA circuit 30C is a direct sense amplifier which couples the output signals S and $\overline{S}$ onto a respective one of the first and second output lines of the common signal path, i.e., functionally a data bus line. The second sensing section 40, which comprises a second sense amplifier, amplifies these output signals from the first sensing section 30.

The first sense amplifiers 30A and 30B of the first sensing section 30 operate much like a normal sense amplifier, that is, they sense the potential of bit lines and output bit line signals as the output signals S and $\overline{S}$. The DSA circuit 30C transmits these bit line signal of the sense amplifiers 30A and 30B to the data bus line collectively as the output signals S and $\overline{S}$.

Each DSA circuit 30C comprises NMOS transistors MN1 and MN4. Each of the pair of bit lines is connected to the gate of a respective one of the transistors MN1 and MN4. The DSA circuit further comprises NMOS transistors MN2 and MN3. MN2 and MN3 are serially connected to NMOS transistors MN1 and MN4, respectively. MN2 and MN3 are coupled to a respective one of the first and second output lines of the common signal path. One of the signals S and $\overline{S}$ is a low level signal. These output signals S and $\overline{S}$ are applied to the second sensing section 40.

The second sensing section 40 comprises, as shown in FIG. 2B, a current mirror circuit 40A comprising PMOS transistors MP3 and MP4; NMOS transistors MN5 and MN6 connected to the current mirror circuit 40A and coupled at their gates to the first sensing section 30 to receive the output S therefrom; a MOS transistor MN7 connected to the current mirror circuit 40A for outputting an output signal OUT and coupled at its gate to the first sensing section 30 to receive the output $\overline{S}$ therefrom; and a MOS transistor MN8 coupled at its gate to a reference signal Vref.

The second sensing section 40 further comprises a current mirror circuit 40B having PMOS transistors MP5 and MP6; MOS transistors MN11 and MN12, which are connected in parallel with one another, connected to the current mirror circuit 40B and coupled to the first sensing section 30 to receive the output $\overline{S}$ therefrom; a MOS transistor MN10 connected to the current mirror circuit for outputting an output signal $\overline{OUT}$ and coupled to the first sensing section to receive the output S at its gate; and a MOS transistor MN9 coupled to a reference signal Vref at its gate.

Now the operation of the circuit, as embodied according to the present invention, will be described with respect to its normal operation. Under the normal operating mode, the column selector selects only one column from the columns YD0 to YDn of the memory device. For example, when YD0 is selected, its cell data in the form of bit line signals, which are complementary to one another, are applied, through the first sense amplifier 30A, to the gates of the NMOS transistors MN1 and MN4, which basically constitute the DSA circuit 30C.

The bit line signals S and $\overline{S}$ associated with the selected YD0 column are applied to a respective one of the gates of the NMOS transistors MN2 and MN3, which are serially connected to the NMOS transistors MN1 and MN4, respectively, thus activating ("switching on") the transistor MN2 and MN3. By this, the bit line signals are outputted to the common signal path (i.e., a data bus line) as S and $\overline{S}$. Accordingly, one of the signals S and $\overline{S}$ becomes a low level signal, and the output of the DSA circuit 30C is applied to the second sensing section 40.

The reference signal Vref (shown in FIG. 2B) is applied to the second sense amplifiers 40A and 40B, is maintained at a high signal level all the time. If the signal S inputted to the second sensing section 40 is high, then the signals which are provided at the gates of the parallelly connected NMOS transistors MN5 and MN6 are high, thus activating these transistors and allowing the currents to flow therethrough. The sum of these currents are mirrored through the PMOS transistor MP3 (which constitutes part of the current mirror circuit) to the transistor MP4, i.e., the same amount of the current flows through MP4.

Under this circumstance, the NMOS transistor MN7, the gate of which has been subject to a low level signal barS, is deactivated ("switched off"). Further, the sum of the currents of the NMOS transistor MN7 and the NMOS transistor MN8 which is connected to MN7 in parallel, and which holds the reference signal Vref flows to the output OUT. Accordingly, the difference between the sum of the currents of the parallelly connected NMOS transistors MN5 and MN6 and the sum of the currents of the parallelly connected NMOS transistors MN7 and MN8 is outputted to the output line OUT to provide a high level signal thereto.

Similarly since the signal S is high and thus the signal $\overline{S}$ is low, the difference between the sum of the currents of the parallelly connected NMOS transistors MN11 and MN12 and the sum of the currents of the parallelly connected NMOS transistors MN10 and MN9 appears on the output line $\overline{OUT}$ having a low signal level. That is, the currents of the parallelly connected NMOS transistors MN11 and MN12 (the gates of which are kept at a low signal level) flow through the PMOS transistor MP6 to the PMOS transistor MP5 as a mirror current (i.e., the same current).

Under this circumstance, the sum of the current of the transistor MN9 (having a reference voltage at its gate) and the current of the transistor MN10 (having a high S signal at its gate) flows to the output line $\overline{OUT}$. That is, the difference between the sum of the currents of the parallelly connected NMOS transistors MN11 and MN12 and the sum of the currents of the parallelly connected transistors MN9 and MN10 is outputted to the output line $\overline{OUT}$. Therefore, the potential level of the output line $\overline{OUT}$ becomes low.

Now the operation of the circuit of the present invention will be described with respect to its multi-bit testing mode. Under the multi-bit testing mode, each cell of the memory device is initially set to a high signal level. Accordingly, if the high signal level is sensed from the cell under test, the cell is judged normal. Alternatively, each cell can be initially set to a low signal level. Then, if the low signal level is sensed, the cell is judged normal.

Under the multi-bit testing mode, at least two columns are selected from the columns YD0 to YDn. If only one of the outputs S and $\overline{S}$ of the data bus line is low, then the cell is judged normal. If both the outputs S and $\overline{S}$ are low, then the cell is judged malfunctioning. For the purpose of explanation, it is assumed that the cell is initially set to a high level under the testing mode. Therefore, if each tested cell is normal, the sense amplifier senses the high level from the cell, and only one of the outputs S and $\overline{S}$ becomes low.

On the other hand, if one of the tested cells malfunctions, i.e., the corresponding bit line which should show a high level would show a low level, and both the output lines S and $\overline{S}$ which have been pre-charged with a certain voltage would become low.

When the cell under test is normal, only one of the outputs S and $\overline{S}$ of the data bus line becomes low, and the subsequent circuit operation is the same as the normal reading operation. However, if any of the tested cells is malfunctioning, both the outputs S and $\overline{S}$ of the first sensing section become low. The second sensing section 40 receives these output data from the output S and $\overline{S}$, and these output data are sufficiently amplified to be transmitted to an output buffer to indicate PASS or FAIL.

More specifically, when the tested cell is malfunctioning, the gates of the parallelly connected NMOS transistors MN5 and MN6 of the second sense amplifier 40A have a low level signal S, while the gates of the parallelly connected NMOS transistors MN11 and MN12 have a low level signal $\overline{S}$. The reference signal Vref is supplied to the gate of the NMOS transistor MN8. Therefore the difference between the sum of the currents of the parallelly connected NMOS transistors MN5 and MN6 and the sum of the currents of the parallelly connected NMOS transistors MN7 and MN8 (which are parallelly connected with the current mirror through the PMOS transistors MP3 and MP4) appears as a low level signal at the output OUT of the second sense amplifier 40A.

Likewise, the difference between the sum of the currents of the parallelly connected NMOS transistors MN11 and MN12 and the sum of the currents of the NMOS transistors MN9 and MN10 (which are parallelly connected with the current mirrored through the PMOS transistors MP6 and MP5) appears as a low level signal at the output $\overline{OUT}$. Thus both the outputs S and $\overline{S}$ of the second sensing section 40 become low, resulting in a high impedance on the output buffer, thereby indicating FAIL for the tested device.

In the above, descriptions were made based on an example in which two cells were tested simultaneously. However, in practice, more than two cells can be tested simultaneously. That is, if all the cells operate normally, when all the cells are initially set to a high level, the bit lines which are associated with each cell, when sensed by the first sense amplifier, shall show a high level as the output S and low level as the output $\overline{S}$. However, if one or more cells are malfunctioning, the bit line that should show a high level would show a low level, resulting in the output lines S and $\overline{S}$ becoming low simultaneously. When the presence of such malfunctioning cells are detected, these cells are tested again to further identify the malfunctioning cell.

According to the present invention, the multi-bit testing circuit, as embodied herein, includes a common signal path for both the first sense amplifiers 30A and 30B under both the normal operating mode and the multi-bit testing mode. Therefore, the operating speeds of the circuit under the normal operating mode and the multi-bit testing mode are substantially the same. Further, the inventive circuit makes it easier to increase the number of cells to be tested, thus suitable for testing the devices having a large memory capacity.

It will be apparent to those skilled in the art that various modifications and variations can be made in light of the above teaching without departing from the spirit or scope of the invention. Thus, it is intended that the present invention cover the modifications and variations of this invention provided they come within the scope of the appended claims and their equivalents.

What is claimed is:

1. A multi-bit testing circuit for testing a semiconductor memory device having a plurality of memory cells, comprising:

a first amplifying means coupled to a first group of memory cells for sensing at least one pair of bit line signals having values complementary to one another, each pair being associated with a respective one of the memory cells of the first group and for providing each of said sensed pair of bit line signals to a respective one of first and second output lines of a common signal path when said first sense amplifying means is activated;

a second amplifying means coupled to a second group of memory cells for sensing at least one pair of bit line signals having values complementary to one another, each pair being associated with a respective one of the memory cells of the second group and for providing each of said sensed pair of bit line signals to a respective one of the first and second output lines of said common signal path when said second sense amplifying means is activated; and a third amplifying means coupled to said first and second output lines of said common signal path for producing an output signal in response to said sensed pair of bit line signals provided on the first and second output lines by said first amplifying means and said second amplifying means when activated.

2. The multi-bit testing circuit of claim 1, further comprising direct sense amplifying means coupled between the first and second amplifying means and the common signal path for receiving said sensed pair of bit line signals from at least one of the first and second amplifying means and for providing said sensed pair of bit line signals onto said common path in response to a column selecting signal.

3. The multi-bit testing circuit of claim 1, wherein said third amplifying means includes means for indicating whether any of the memory cells sensed by at least one of the first and second amplifying means is defective based on said output signal.

4. The multi-bit testing circuit of claim 1, wherein said third amplifying means includes means for checking whether said pair of bit line signals provided on said first and second output lines by activated ones of said first amplifying means and said amplifying means are identical to one another and means for determining whether a defective cell is present in the memory device based on a checking result of said checking means.

5. The multi-bit testing circuit of claim 1, further comprising a plurality of direct sense amplifying means, each corresponding to a column representing the array of memory cells of the memory device and coupled between a respective one of the first and second amplifying means and the common signal path for receiving said sensed pair of bit lines corresponding to said column from said respective one of the first and second amplifying means and for providing said sensed pair of bit lines to said first and second output lines of the common signal path.

6. The multi-bit testing circuit of claim 1, wherein said third amplifying means includes:

a first transistor means for receiving a first signal from the first output line;

a second transistor means for receiving a second signal from the second output line;

a first current control means coupled to said first transistor means for providing a first current corresponding to the first signal;

a second current control means coupled to said second transistor means for providing a second current corresponding to the second signal; and a means coupled to said first and second current control means for providing an output signal based on said first and second currents.

7. The multi-bit testing circuit of claim 1, wherein said third amplifying means includes:

a current mirror circuit;

a first MOS transistor coupled to said current mirror circuit for receiving a signal from the first output line;

a second MOS transistor coupled to said current mirror circuit for receiving a signal from said second output line; and a third MOS transistor coupled to said current mirror for receiving a reference signal.

8. The multi-bit testing circuit of claim 2, wherein said direct sense amplifying means includes a first pair of MOS transistors connected in series with respect to one another, and a second pair of MOS transistors connected in series with respect to one another, said first and second pairs being connected in parallel with respect to one another, each of said first and second pairs being coupled to a respective one of said sensed pair of bit lines and a respective one of said first and second output lines.

9. The multi-bit testing circuit of claim 6, wherein said second transistor means includes means for receiving a reference signal, and wherein said second current control means includes means for providing said second current based on said second signal and said reference signal.

10. A multi-bit testing circuit for testing a semiconductor memory device having a plurality of memory cells, comprising:

a plurality of first amplifying means coupled to said plurality of memory cells for sensing one or more pairs of bit line signals corresponding to a column selection signal;

a direct sense amplifier (DSA) circuit coupled to said plurality of first amplifying means for providing said sensed one or more pairs of bit line signals on a common signal path having first and second output lines; and a second amplifying means coupled to said common signal path for providing an output signal based on the sensed one or more pairs of bit line signals provided on said first and second output lines.

11. A multi-bit testing circuit for a semiconductor memory device, comprising:

a first sensing section comprising a sense amplifier connected to a memory cell of the semiconductor memory device to receive bit line signals therefrom, and a direct sense amplifier (DSA) circuit for receiving the bit line signals from the sense amplifier and column selecting signals so as to output the bit line signals as signals S and $\overline{S}$; and a second sensing section for receiving the signals S and $\overline{S}$ from the first sensing section and for producing a first output signal, indicating a normal semiconductor memory device, when the signals S and $\overline{S}$ have values complementary to one another, and for producing a second output signal, indicating a defective semiconductor memory device, when the signals S and $\overline{S}$ have a same signal level.

12. The circuit as claimed in claim 11, wherein the DSA circuit comprises a pair of first MOS transistors for receiving the bit line signals, and a second MOS transistor, connected to the pair of first MOS transistors in series, and having a gate for receiving the column selecting signals, whereby the second MOS transistor is turned on by the column selecting signals to allow the pair of first MOS transistors to transmit the bit line signals as the signals S and $\overline{S}$.

13. The circuit as claimed in claim 11, wherein the second sensing section comprises first and second sets of elements;

the first set of elements comprising a first current mirror circuit, first parallel-connected MOS transistors connected to the first current mirror circuit and receiving the signal S from the first sensing section, a second MOS transistor connected to the first current mirror circuit and receiving the signal $\overline{S}$ from the first sensing section, and a third MOS transistor connected to the first current mirror circuit and receiving a reference signal; and the second set of elements comprising a second current mirror circuit, fourth parallel-connected MOS transistors connected to the second current mirror circuit and receiving the signal $\overline{S}$ from the first sensing section, a fifth MOS transistor connected to the second current mirror circuit and receiving the signal S from the first sensing section, and a sixth MOS transistor connected to the second current mirror circuit and receiving the reference signal;

whereby the first and second output signals are outputted from the second sensing section at a node commonly connected to the first current mirror circuit, the second MOS transistor, and the third MOS transistor, and at a node commonly connected to the second current mirror circuit, the fifth MOS transistor, and the sixth HOS transistor.

14. A multi-bit testing circuit for a semiconductor memory device, comprising:

a first sense amplifier for receiving bit line signals from memory cells of the semiconductor memory device;

a direct sense amplifier (DSA) circuit for outputting said bit line signals from the first sense amplifier as signals S and $\overline{S}$ onto a data bus line; and a second sense amplifier connected to the data bus line for producing amplified signals S and $\overline{S}$;

whereby the memory cells of the semiconductor memory device are determined to be normal or defective based on values of the amplified signals S and $\overline{S}$.

15. The circuit as claimed in claim 14, wherein said second sense amplifier comprises first and second sets of elements;

the first set of elements comprising a first current mirror circuit, parallel-connected MOS transistors connected to the first current mirror circuit and receiving the signal S from the DSA circuit, a MOS transistor connected to the first current mirror circuit and receiving the signal $\overline{S}$ from the DSA circuit, and a MOS transistor connected to the first current mirror circuit and receiving a reference signal; and the second set of elements comprising a second current mirror circuit, parallel-connected MOS transistors connected to the second current mirror circuit and receiving the signal $\overline{S}$ from the DSA circuit, a MOS transistor connected to the second current mirror circuit and receiving the signal S from the DSA circuit, and a MOS transistor connected to the second current mirror circuit and receiving the reference signal.

16. The circuit as claimed in claim 14, wherein said DSA circuit comprises a pair of MOS transistors for receiving the bit line signals, and a MOS transistor, connected to the pair of MOS transistors in series, and having a gate for receiving column selecting signals, whereby the MOS transistor is turned on by the column selecting signals to allow the pair of MOS transistors to output the bit line signals onto the data bus line as the signals S and $\overline{S}$.

* * * * *

UNITED STATES PATENT AND TRADEMARK OFFICE
CERTIFICATE OF CORRECTION

PATENT NO. : 5,568,434
DATED : October 22, 1996
INVENTOR(S) : Yong-Weon JEON

It is certified that error appears in the above-indentified patent and that said Letters Patent is hereby corrected as shown below:

Claim 4, Column 8, Line 19, "said amplifying" should read --said second amplifying--.

Claim 13, Column 10, Line 15, "HOS" should read --MOS--.

Signed and Sealed this

Twenty-fifth Day of February, 1997

Attest:

BRUCE LEHMAN

*Attesting Officer*   *Commissioner of Patents and Trademarks*